United States Patent [19]

Tsujiyama et al.

[11] 4,242,662
[45] Dec. 30, 1980

[54] METHOD AND APPARATUS FOR PATTERN EXAMINATION

[75] Inventors: Bunjiro Tsujiyama, Musashino; Kunio Saito; Kenji Kurihara, both of Tokorozawa, all of Japan

[73] Assignee: Nippon Telegraph and Telephone Public Corporation, Japan

[21] Appl. No.: 25,447

[22] Filed: Mar. 30, 1979

[30] Foreign Application Priority Data

Oct. 16, 1978 [JP] Japan .................. 53-127654

[51] Int. Cl.³ .................................. G06K 9/32
[52] U.S. Cl. ............... 340/146.3 H; 340/146.3 MA; 340/146.3 AE
[58] Field of Search ........... 340/146.3 H, 146.3 MA, 340/146.3 AC, 146.3 AE; 364/488-491, 515; 250/562, 572, 563, 561

[56] References Cited

U.S. PATENT DOCUMENTS

| | | |
|---|---|---|
| 3,613,080 | 10/1971 | Angeloni et al. ......... 340/146.3 MA |
| 3,898,617 | 8/1975 | Kashioka et al. ......... 340/146.3 MA |
| 4,021,778 | 5/1977 | Ueda et al. ............. 340/146.3 AC |
| 4,107,648 | 8/1978 | Frank .................... 340/146.3 H |
| 4,156,231 | 5/1979 | Edamatsu et al. ......... 340/146.3 H |

OTHER PUBLICATIONS

Bruning et al, "An Automated Mask Inspection System-Amis", *IEEE Trans. on Electron Devices*, vol. ED-22, No. 7, Jul., 1975, pp. 487-495.
Wojcik, "Automatic Detection of Semiconductor Mask Defects", *Micro-Electronics and Reliability*, vol. 15, pp. 585-593, Pergamon Press, 1976.
Ciarlo, "Automated Photomask Inspection", *Solid State Technology*, May, 1978, pp. 51-59.

*Primary Examiner*—Leo H. Boudreau
*Attorney, Agent, or Firm*—Charles W. Helzer

[57] ABSTRACT

A pattern to be examined is scanned to produce binary information of divisional regions of the pattern corresponding to the picture elements of respective scanning lines as parallel information. The parallel information regarding the shape and position of the pattern is concurrently examined under two modes. The second mode includes examination of the vertical edge and the horizontal edge, examination of the vertical and horizontal edges by compensating the deviation of mask setting in the horizontal direction, and examination of the vertical and horizontal edges by compensating the deviation of mask setting in the vertical direction.

8 Claims, 19 Drawing Figures

(MINIMUM PATTERN WIDTH)

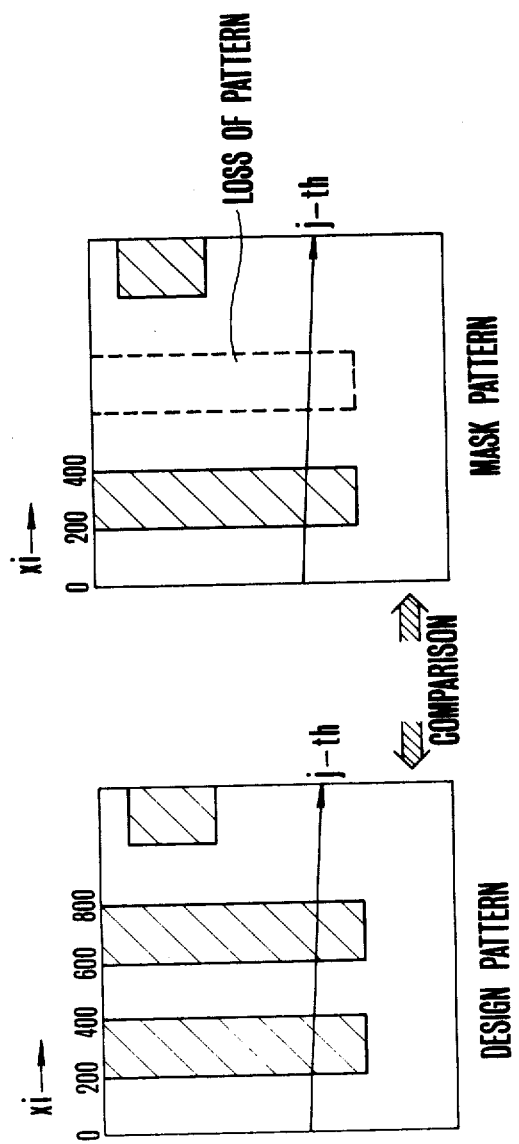

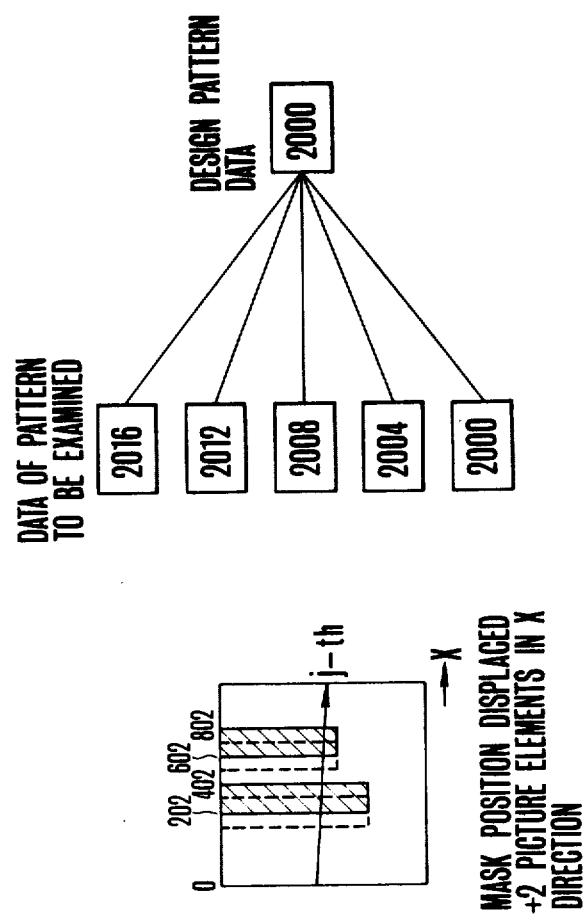

1st GROUP OF MEMORY ELEMENTS

2nd GROUP OF MEMORY ELEMENTS

2nd GROUP OF MEMORY ELEMENTS

METHOD AND APPARATUS FOR PATTERN EXAMINATION

BACKGROUND OF THE INVENTION

This invention relates to a method and apparatus for examining a pattern capable of producing an output which represents whether an examined pattern is a predetermined pattern or not, or whether it is located at a predetermined position or not. The invention is especially suitable for examining a minute pattern such as a pattern of a mask utilized to prepare a semiconductor integrated circuit device or a pattern formed by such mask and utilized to fabricate a semiconductor integrated circuit device.

Typical methods for examining such a minute pattern as that of a semiconductor integrated circuit device are a chip-chip comparing method disclosed, for example, in IEEE Transaction on Electron Device, Vol. ED-22, No. 7, July 1975, PP487-495; a mask-mask comparing method, a design pattern data comparing method and a spatial filtering method disclosed, for example, in Solid State Technology, May, 1978, PP51-59; and a pattern analyzing method disclosed, for example, in Microelectronics and Reliability, Vol. 15, PP 585-593, Pergamon Press, 1976, printed in Great Britain.

According to the chip-chip comparing method, adjacent chips on the same mask are enlarged and compared with two optical systems to find out a coincidence, whereas according to the mask-mask comparing method a working mask is compared with a master mask. In each of these two methods, two optical systems are used for finding out coincidence of the images so that the limit of the defect detection is 2 to 3 microns and the setting of the masks is difficult. According to the design pattern data comparing method, an original design pattern data utilized for preparing a reticle is compared with a mask to be examined, whereas according to the spatial filtering method a crisscross shaped spatial filter is installed on the focal plane of a magnifying lens to intercept the diffraction light caused by a normal pattern so as to transmit only the diffraction light caused by a defect, thereby detecting the same. According to the pattern analyzing method, an magnified image of a mask is converted into a video signal by an image pickup tube or the like, and the video signal is checked by a method analogous to the pattern recognition so as to judge as a defect an irregular portion different from a pattern of LSI, etc.

Since each of the design pattern comparing method, the spatial filtering method, and the pattern analyzing method utilizes a single optical system, it is possible to pickup an image at a high resolution. However, the design pattern comparing method and the spatial filtering method are not inherently suitable for the detection of minute defects. More particularly, according to the prior art design pattern comparing method, it is extremely difficult to set the mask so that there are such difficulties as a mask setting error, distortion of the image and increase in the data. For this reason, these methods are not suitable to examine minute patterns. Although the spatial filtering method is easy to set a mask, the S/N ratio is small. Accordingly, only the pattern analyzing method is suitable for examining minute or micro patterns of LSI or the like.

In the examination of the LSI pattern, it is essential not only to examine the minute pattern but also to detect loss of pattern which occurs when a pattern is transferred from a reticle to a master mask. Since the minimum pattern width of the mask for an LSI is determined by a pattern rule so that it is necessary to detect a defect less than a width determined by this pattern rule. The pattern analyzing method may be used for this purpose, whereas the design pattern data comparing method may be used for detecting the loss of pattern and large defects. Accordingly, it has long been desired to provide a method of examining a pattern capable of rapidly and accurately examining a minute pattern and defective loss of pattern.

SUMMARY OF THE INVENTION

Accordingly, it is an object of this invention to provide a method of examining a pattern capable of examining not only a minute pattern but also such a large pattern defect as loss of the pattern.

Another object of this invention is to provide a method of examining the position of a pattern by way of various expedients.

Still another object of this invention is to provide a novel pattern examining apparatus capable of simultaneously examining a minute pattern and the position thereof.

A further object of this invention is to provide a circuit suitable to examine the position of a pattern.

According to one aspect of this invention, there is provided a method of examining a pattern comprising the steps of (a) scanning a pattern region formed with a pattern to be examined to obtain a video signal and then converting the same into a binary video signal; (b) applying said binary video signal to a plurality (P) of shift registers, the number P being less than the number of scanning lines necessary for producing the binary video signal from the entire area of the pattern, each shift register including Q memory elements connected in series wherein Q is less than N which is obtained by dividing one scanning line of said binary video signal with the length of one picture element, said plurality of shift registers being connected in series through delay circuits having each a delay corresponding to the length of (N-Q) memory elements connected in series; (c) constituting a first group of memory elements with at least one memory element among Q memory elements of an intermediate shift register of said serially conneted P shift registers except the first and the last shift registers, at least one memory element among Q memory elements of a shift register between said first and intermediate shift registers, and at least one memory element among Q memory elements of shift register between said last and intermediate shift registers, and simultaneousely deriving out said binary video signals respectively from said plurality of memory elements of said first group to form a first examination parallel binary video signal; (d) constituting a second group of memory elements with adjoining first and second memory elements among Q memory elements of an intermediate shift register of said serially connected P shift registers, a third memory element among Q memory elements of a shift register between said first and intermediate shift registers, and a fourth memory element among Q memory elements of a shift register between said intermediate and the last shift registers, and simultaneously deriving out said binary video signals respectively from said memory elements of said second group to constitute a second examination parallel binary video signal; (e) logically processing said first examination parallel binary video signal to obtain a first examination output representing whether said pattern is a predetermined pattern or not; (f) producing pattern position information, when the first memory element of said second group is scanned earlier than said second memory element of the same group on one scanning line related to said first and second memory elements thereby producing binary video signals and when the contents of the binary video signals produced by said first and second memory elements differ from each other, by representing the sum of values of a function of the distance between a reference position on said one scanning line and the positions of picture elements corresponding to said first and second memory elements in terms of the number of the picture elements; (g) comparing said pattern position information with reference pattern position information prepared from design pattern information utilized to form said pattern in said pattern region, thereby obtaining a second examination output representing whether or not said pattern is located at a predetermined position in the direction of scanning said pattern region; (h) logically processing the parallel binary video signals obtained from said third and fourth memory elements of said second group to produce logically treated binary video signals which, when said third and fourth memory elements are aligned step by step of one picture element length, are utilized to produce a third examination output, said logically treated binary video signals representing whether or not they have different contents at positions on both vertical sides of one picture element, said third examination output representing whether said third and fourth memory elements are at a predetermined position or not in the direction of scanning; (i) compensating said second examination output with said third examination output in order not to recognize the normal horizontal edge as a defect, producing a fourth examination output; and (j) producing a final examination output based on said fourth and first examination outputs, said final examination output representing whether said pattern is a predetermined pattern or not and whether said pattern is located at a predetermined position or not.

According to another aspect of this invention there is provided apparatus for examining a pattern comprising a pattern examination signal generating unit for scanning a pattern to be examined to produce binary information of divisional regions of said pattern corresponding to picture elements of respective scanning lines as parallel information; a pattern shape examination circuit unit supplied with said parallel information at timings corresponding to predetermined picture elements on respective scanning lines for examining the detail of said pattern; a pattern position examining circuit unit supplied with said parallel information at timings corresponding to said predetermined picture elements to exmamine the position of said pattern; and a computer responsive to examination outputs of said pattern shape examination circuit unit and said pattern position examination circuit unit for producing a reference pattern data to be compared with the examination pattern data produced by said pattern position examination circuit unit, and controlling said pattern examination signal generating unit, said pattern shape examination circuit unit and said pattern position examination circuit unit, said pattern shape examination circuit unit including a first logic circuit for processing said parallel information, a first gate circuit connected to the output of said logic circuit and operated at a timing corresponding to said predetermined picture element, and a memory circuit for storing the output of said gate circuit which is reset by a pulse synchronized with the scanning line, and said pattern position detection circuit including a second logic circuit for logically processing parallel information of divisional regions of the pattern corresponding to at least two picture elements on one scanning line, a second gate circuit connected to the output of said second logic circuit, a counter connected to receive the output of said second logid circuit through said second gate circuit for effecting addition only when the output of said second logic circuit is at one level and cleared by said pulse synchronized with said scanning line, a comparator for comparing the output (that is the pattern data) of said counter with said reference data received from said computer through a shift register to produce a first examination output, and a third logic circuit for logically processing parallel information of divisional regions of said pattern corresponding to said picture elements on said one scanning line and picture elements on two scanning lines adjacent to said one scanning line for examining a horizontal edge of said pattern, an NAND gate circuit with one input connected to received the pattern horizontal edge signal produced by said third logic circuit and the other input supplied with a horizontal edge pattern data formed under control of said computer via a register to produce a second examination output, and an AND gate circuit responsive to said first and second examination outputs for producing a final examination output.

BRIEF DESCRIPTION OF THE DRAWINGS

Further object, advantages and features of this invention can be more fully understood from the following detailed description taken in conjunction with the accompanying drawings in which:

FIG. 4 is a diagram useful to explain the principle of the other mode of the examining metod of this invention;

FIGS. 5A, 5B and 5C are diagrams for explaining different expedients of the examining method of this invention;

DESCRIPTION OF THE PREFERRED EMBODIMENTS

Figure 1:
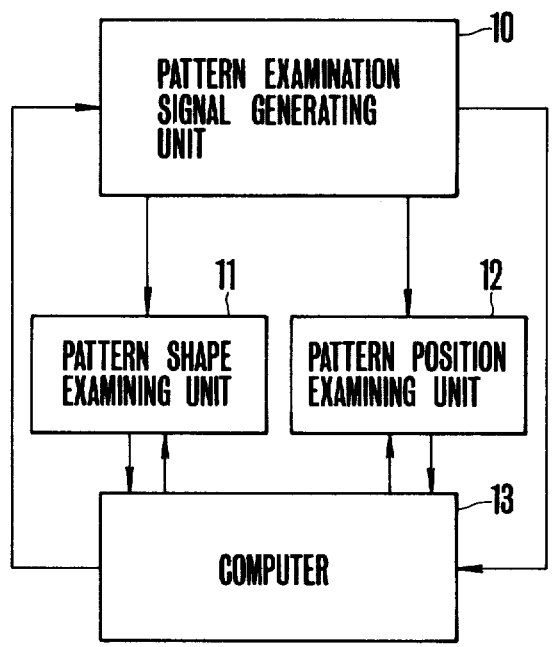
FIG. 1 is a schematic block diagram useful to explain the outline of the method of examining a pattern according to this invention.

The outline of the method of examining a pattern according to this invention will first be described with reference to FIG. 1. Various portions of a pattern such as of an LSI is examined by scanning it with a sensor at a pattern examination signal generating unit 10. The signal generated by the sensor is usually an analogue electrical signal. This signal is converted into a binary signal and stored in a memory device as parallel information representing a predetermined region of the pattern being examined. As the memory device may be used a plurality of shift registers. The parallel information thus stored are read out at a predetermined timing and sent to a pattern shape examining unit 11 and a pattern position examining unit 12. In the pattern shape examining unit 11, an examination for detecting a minute defect having a width of 1 micron is effected while in the pattern position examining unit 12, the parallel information is compared with a design pattern data stored in an electronic computer 13 to detect such a large pattern defect as loss of pattern. The outputs of the examining units 11 and 12 are supplied to the computer 13 which also controls the entire system.

Figure 2A:
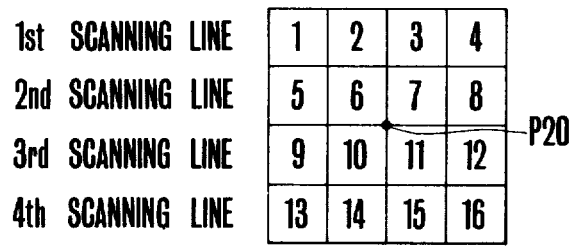
FIGS. 2A through 2C are diagrams for explaining a method of forming parallel information utilized in the method of this invention.
Figures 2B, 2C:
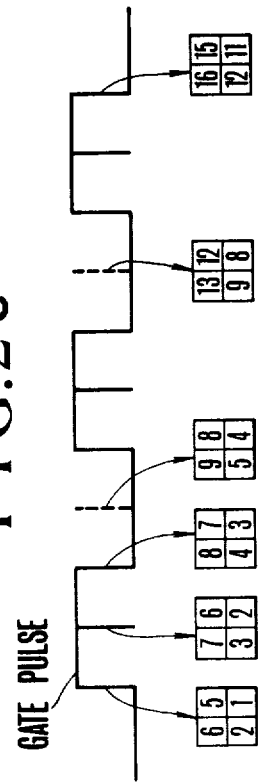

The procedure of forming the parallel information will now be outlined with reference to FIGS. 2A, 2B and 2C. FIG. 2A shows a region of the pattern to be examined which is picked up by a sensor such as an image pickup tube positioned above (normal to the sheet of drawing) the center P20. A number of segments, 16 segments 1 to 16 in the illustration, correspond to picture elements of the scanning lines produced when an electron beam scans a target in the image pickup tube. In consequence, as the first scanning line in the image pickup tube runs, information regarding the segments 1, 2, 3 and 4 of the first scanning line (the information is of a binary form, and for example, when a pattern is present at segment 1, information is "1"; when a pattern is absent, information is "1") will be obtained. In the same manner, information regarding segments of the second, third and fourth scanning lines is obtained, and the scanning of one field of the image pickup tube completes when a picture element corresponding to segment 16 is scanned. Although 16 segments are shown for clarity of description, it will be clear that in an actual image pickup tube, the pattern region to be examined may be divided into a large number of segments.

FIG. 2B shows a memory device for storing information regarding respective segments shown in FIG. 2A, the memory device comprising a shift register having four memory elements in the upper stage and two memory elements in the lower stage. The shift register is constructed to be shifted by a clock pulse synchronized with the picture element. Assume now that the information is sequentially applied and shifted starting from information concerning segment 1 of the first scanning line. Then, when the electron beam of the image pickup tube reaches a picture element corresponding to segment 6 of the second scanning line, the memory elements of the shift register are storing information regarding the segments 1, 2, 3, 4, 5 and 6 as shown at the lefthand, uppermost block in FIG. 2B. Under this condition, the information regarding segments 1, 2, 5 and 6 is stored in four memory elements (two in the upper stage, two in the lower stage which are designated as "window") although the order of the segments is substantially different from that shown in FIG. 2A. The two memory elements designated as "delay line" contribute to a stepwise shift by one segment as will be described later.

When the scanning of the image pickup tube reaches a picture element corresponding to segment 7, the information regarding segments 2, 3, 6, 7 is stored in the window (second of the upper block in FIG. 2B), and when the scanning reaches a picture element corresponding to segment 8, information regarding segments 3, 4, 7 and 8 is stored in the window (third of the upper block in FIG. 2B).

In this manner, the overall region of the pattern to be examined comprising 16 segments are scanned to shift the divisional regions having each 4 segments stepwise by one segment. In the windows shown in FIG. 2B except for windows of the righthand blocks of the uppermost and middle blocks is stored information regarding 9 divisional regions thus obtained.

As has been described hereinabove, the shift register is provided with a delay line comprising two memory elements. It should be understood that the delay line ensures one segment step shift of each divisional region.

Considering the windows of the righthand, uppermost and middle blocks, the window of the uppermost block stores the information regarding segments 4, 5, 8 and 9 whereas the window at the middle block stores the information regarding segments 8, 9, 12 and 13, so that these windows do not constitute effective divisional regions to be shifted stepwise by one segment. Since information appearing in these windows disturbs the stepwise shift, it is prohibited when reading out parallel information as will be described later.

The parallel information thus obtained can be read out from the windows of the shift register by using a picture element synchronizing pulse gated by a gate pulse as shown in FIG. 2C. The gate pulse prohibits picture element synchronizing pulses (shown by dotted lines) when aforementioned disturbing information takes place.

Figure 3A:
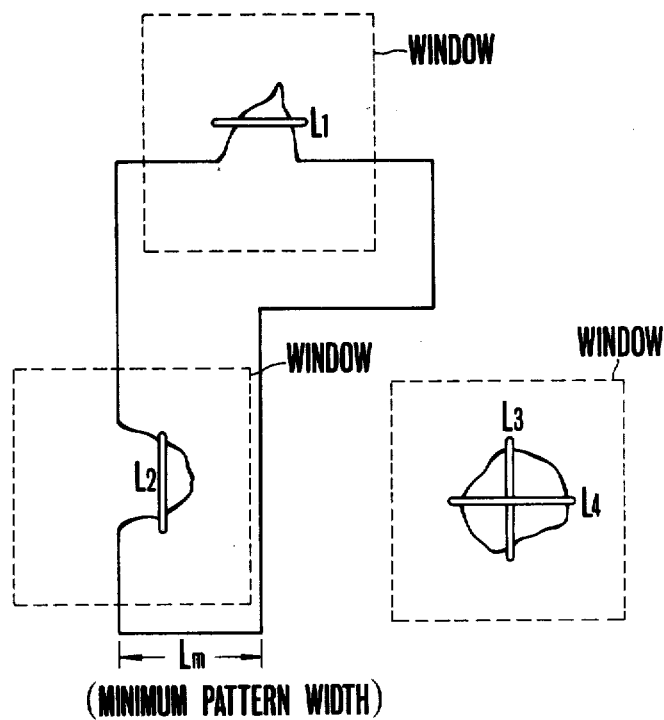
FIGS. 3A and 3B are diagrams useful to explain the principle of one mode of the examining method of this invention.
Figure 3B:
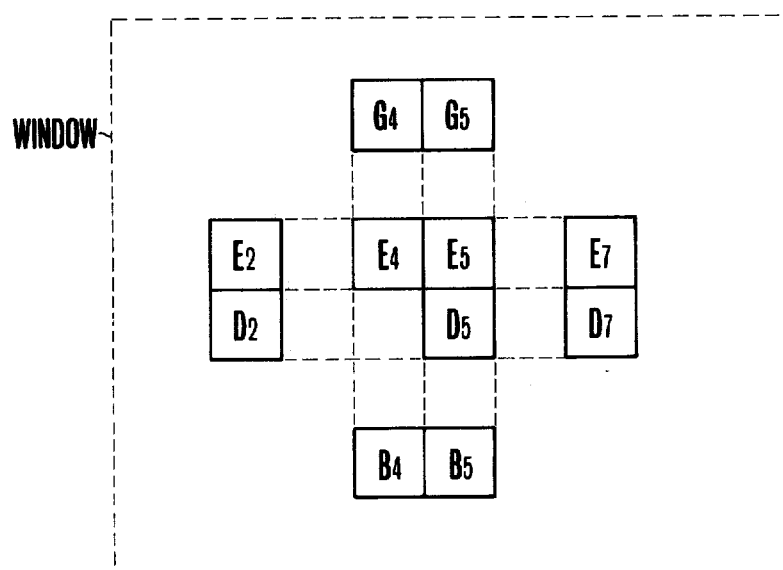

FIGS. 3A and 3B are used to explain the principle of one mode of examining the parallel information produced in a manner described above. The mode described herein is based on the aforementioned pattern analyzing method.

Assume now that pattern defects appear in the window and that the pattern irregularities have a size determined by L1, L2, L3 and L4 shown in FIG. 3A. If L1, L2, L3, and L4 are smaller than a minimum pattern width Lm, it is judged that these irregularities are defects. This judgement can be made by detecting the presence or absence of two pattern edges, that is, the existence of a narrow pattern according to the following logical equation:

$$X = (\overline{D2} \wedge \overline{E2} \wedge D5 \wedge E5 \wedge \overline{D7} \wedge \overline{E7}) \\ \vee (D2 \wedge E2 \wedge \overline{D5} \wedge \overline{E5} \wedge D7 \wedge E7) \\ \vee (\overline{B4} \wedge \overline{B5} \wedge E4 \wedge E5 \wedge \overline{G4} \wedge \overline{G5}) \\ \vee (B4 \wedge B5 \wedge \overline{E4} \wedge \overline{E5} \wedge G4 \wedge G5) = 1 \quad (1)$$

Where a pattern in a window is detected by dividing it into the segments shown in FIG. 3B, if one edge of the pattern lies between segments E2, D2 and a segment E5, D5 and the other edge lies between segments E5, D5 and segments E7, D7 so that the pattern occupies segments E5 and D5, binary information of the corresponding segments includes D2="0", E2="0", D5="1", E5="1", D7="0", and E7="0". Accordingly, the logical product of the first term of Equation (1) is "1" since $\overline{D2}$="1", $\overline{E2}$="1", D5="1", E5="1", $\overline{D7}$="1" and $\overline{E7}$="1". When the one and the other edges belong to different patterns, there is an inverted image to the pattern occupying the segments E5 and D5. Consequently, the logical product of the second term is "1".

A similar logic holds when edges are present between segments E4, E5, and segments B4, B5 and between segments E4, E5 and segments G4, G5, respectively, so that both the third and fourth terms of equation (1) become "1". When either one of the first through fourth terms is "1", the logical sum of these terms is "1" so that by utilizing the fact that the value of the logical equation is "1", it is possible to detect any edge in the horizontal and vertical directions.

Especially, in an LSI of 2-micron pattern rule wherein $Lm=2\mu$ is prescribed, if one picture element has a size of $0.4\mu$, an irregularity having a pattern width or a loss width less than five picture elements is judged as a defect.

FIG. 4 is a diagram useful to explain the principle of the second mode for examining parallel information according to this invention. Although the mode is the same as that of the design pattern comparing method described above in that a design pattern is compared with a pattern to be examined, according to this invention the amount of data is decreased by adding together picture elements instead of fetching each picture element.

Suppose now that a design pattern shown on the left-hand side of FIG. 4 has a pattern at the shaded portions and that the pattern residing between 200th and 400th picture elements and between 600th and 800th picture elements from the lefthand side is examined by the j-th scanning line. According to this invention, the sum Dj of a distance xi over which the j-th scanning line runs is calculated according to the following equation $$Dj = \Sigma xi$$
$$= 200 + 400 + 600 + 800 = 2000.$$

This Dj is used as the design pattern data.

As shown in the righthand side of FIG. 4, when a mask pattern to be examined which is based on this design pattern is lost between the 600th and 800th picture elements, D'j corresponding to Dj becomes $$D'j = \Sigma xi$$
$$= 200 + 400 = 600$$

For this reason, by comparing Dj and D'j the presence or absence of a lost pattern can be detected. Although, in the foregoing description the sum of xi was used for comparison, the sum of $xi^2$ or $xi^3$ can also be used. Thus, generally speaking, a comparison can be made by using $\Sigma f(xi)$.

According to this mode, it is necessary to detect with the j-th scanning line only the pattern edges being present at the 200th, 400th 600th, and 800th picture elements so that it is only necessary to process the following logical equation $$W = (W1 \wedge \overline{W2}) V (\overline{W1} \wedge W2) \qquad (2)$$

where W1 represents binary information of a segment on the right of an edge at a distance of 200 picture elements, and W2 represents binary information of a segment on the left.

Since W1="1" and W2="0", $(W1 \wedge \overline{W2})$="1" and W="1" irrespective of the value of $(\overline{W1} \wedge W2)$, thus indicating the presence of an edge. On the other hand, $(\overline{W1} \wedge W2)$ detects the edge of an inverted image.

Figure 5A:
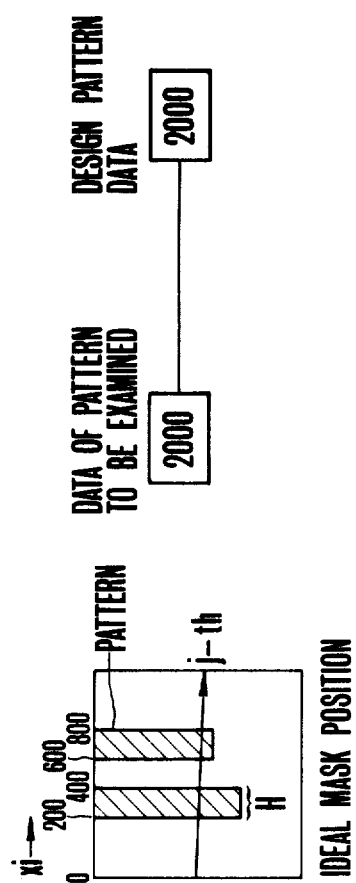
Figure 5C:
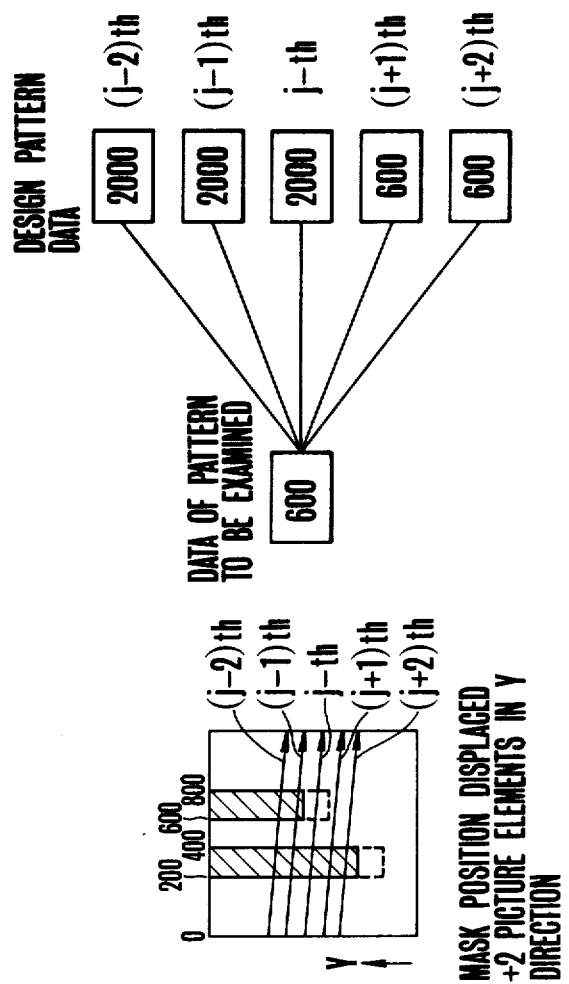

Based on the principle shown in FIG. 4, the method of examination of this invention can be variously modified as shown in FIGS. 5A, 5B and 5C. FIG. 5A shows a basic expedient in which a pattern data to be examined is compared with a design pattern data when a mask is ideally set. In this case, when a coincidence is obtained as a result of the comparison of $\Sigma xi = 2000$, it is judged that there is no defect. However, if it were judged that there is a defect when a coincidence is not obtained with $\Sigma xi = 2000$, the setting of the mask would become extremely difficult or impossible. Modifications or expedients which can alleviate the condition of setting the mask are shown in FIGS. 5B and 5C. In the case shown in FIG. 5B, even when the mask is shifted in the directon of X, it is judged that the pattern data being examined has no defect so long as any of the examined pattern data coincide with the $\Sigma xi$ of the design pattern data. This is the case that the setting of the mask is allowable to be shifted in the X directon within a range of by $\pm 2$ picture elements (In FIG. 5B patterns are illustrated as being shifted by $+2$ picture elements and shaded. The patterns at the normal position are shown by dotted lines.) On the other hand, in the case shown in FIG. 5C, even when the mask setting is shifted in the Y direction, so long as the shift is within the range of $\pm 2$ picture elements, it is judged that the examined pattern has no defect when the examined pattern data coincides with any of xi of the design pattern data (In FIG. 5C, only the patterns shifted by $+2$ picture elements are shaded). Accordingly, design pattern data $\Sigma xi$ related to the (j−2)th, (j−2)th, (j+1)th and (j+2)th scanning lines which are out of phase by $\pm 2$ and $\pm 1$ picture elements with respect to the j-th scanning line are used together with a design pattern data $\Sigma xi$ related to the j-th scanning line so as to judge that the pattern data has no defect when any of the design pattern data coincide with the examined pattern data. For this reason, comparisons of $5 \times 5 = 25$ combinations are performed at the end of every scanning by taking into consideration shifts of $\pm 2$ picture elements in the X and Y directions. Then, if at least one of the values from the 25 combinations is coincident, the pattern examined is considered normal.

Having described the basic concept necessary to understand, the invention, one example of the apparatus for examining patterns of this invention will be described hereunder with reference to FIG. 6, in which elements identical to those shown in FIG. 1 are designated by the same reference numerals.

Figure 7:
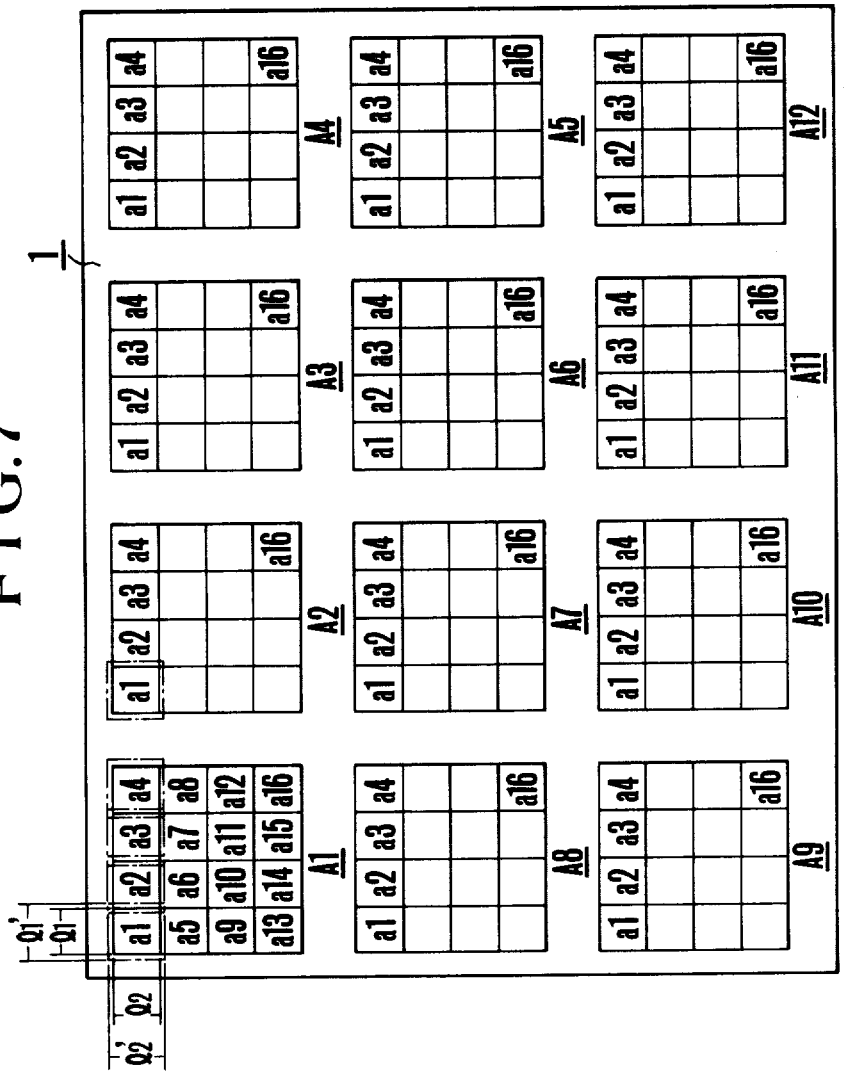
FIG. 7 is a diagram showing an array of patterns examined by the apparatus shown in FIG. 6.

As shown, a pattern 601 including a region A to be examined is mounted on a support 603 driven by a driving mechanism 602. When the support 603 is driven, the pattern 601 is brought beneath a device 604 to produce a video signal S1 by scanning the region A. In this example, region A comprises 12 regions A1 through A12 as shown in FIG. 7 which are arranged in 3 rows and 4 columns. Regions A1 through A4 are arranged from left to right, regions A5 through A8 from right to left, and regions A9 through A12 from left to right. A position signal generator 605 in the form of a laser interferometer is associated with the support 603 for generating a position signal B1 which represents the position relative to the device 604 and which is supplied to a computer 13 to be described hereinafter. The device 604 comprises a lamp 607 controlled by a control signal B2 supplied from the computer 13 for momentarily illuminating the pattern region A of the pattern 601 and a well known image pickup tube 608 including a photoelectric converting surface (not shown) which picks up momentarily the illuminated region and stores information thereof, and means (not shown) to scan the photoelectric converting surface for reading out the information regarding the pattern regions stored in the surface as a series of video signals on time base.

For the sake of simplicity, it is assumed that each one of the regions A1 through A12 is a square as shown in FIG. 7, and that each region is divided into 16 segments a1 through a16 each having a width l1 and a height l2. The 16 segments a1 through a16 are arranged in 4 rows and 4 columns. Further, it is assumed that the viewing field on the region A of the image pickup tube 608 is a square defined by l1'; and l2' which are longer than l1 and l2, respectively.

The driving mechanism 602 is driven by a control signal B3 which is generated by the computer 13 by taking into consideration the position signal B1 supplied by the position signal generator 605 so as to drive the support 603 at a uniform speed such that it is moved successively, with the center of the field of the image pickup tube 603 coinciding with the center of the segment a1 of the region A1 of the pattern 601, from a position to positions at which the center of the fields coincides with the respective centers of the segments a2, a3 and a4 of region A1, and then to positions at which the center of the field coincides with the respective centers of the segments of respective regions A1 through A12.

The times at which the center of the field of the image pickup tube 608 comes to coincide with the centers of successive segments of the regions A1 through A12 of the pattern 601 are denoted by t1, t2, t3 . . . t192. The lamp 603 is caused to flash at the times t1, t2, t3 . . . t192, shown at A in FIG. 8, by the control signal B2 generated by the computer 13 by taking into consideration the position signal B1. Thus, the image pickup tube 608 picks up portions of the pattern at respective segments of the regions A1 through A12 at times t1 through t192 to store the image thereof on the photoelectric converting surface.

Figure 8:
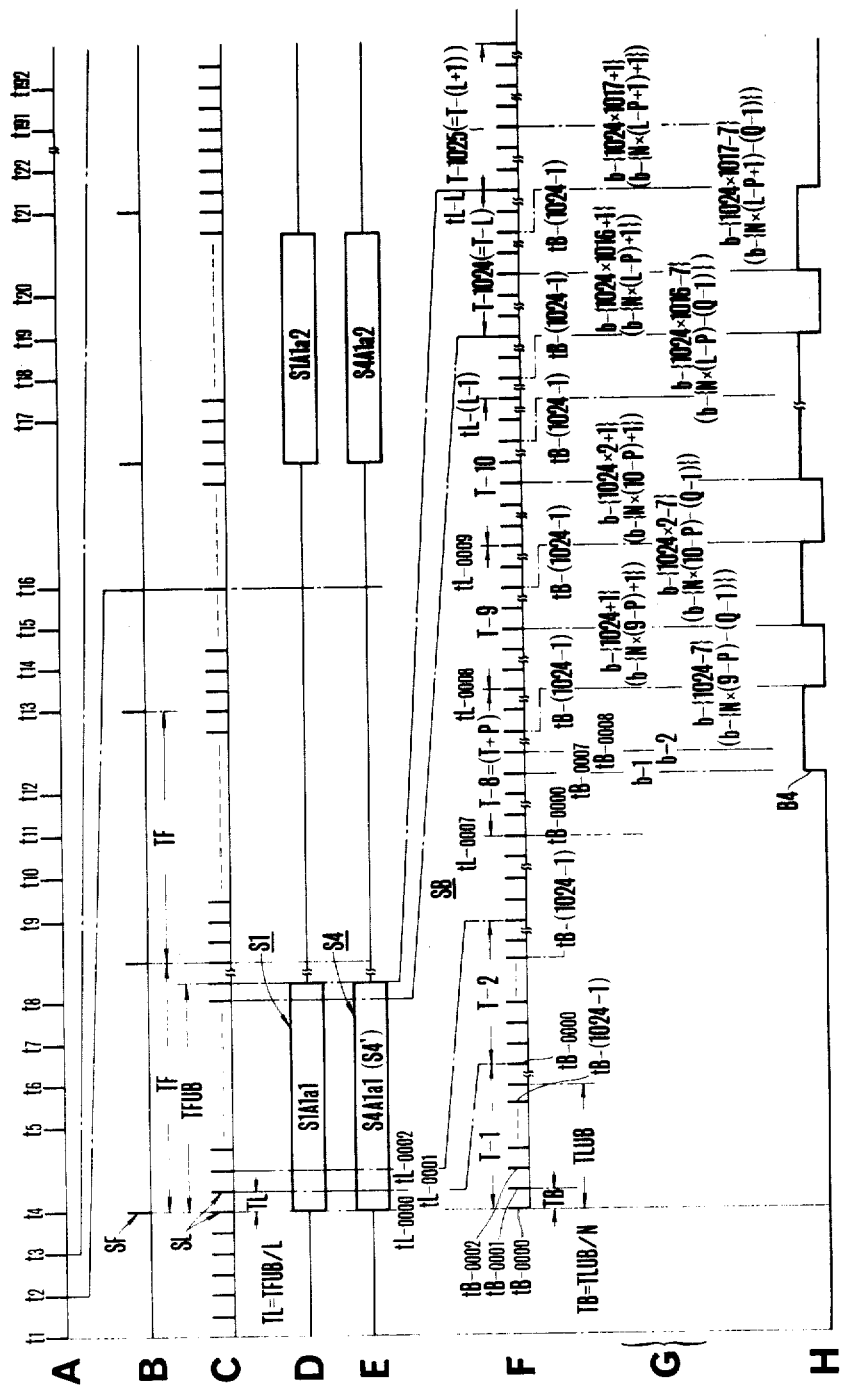
FIG. 8 is a time chart useful to explain the operation of the apparatus shown in FIG. 6.

As shown by a magnified scale at B in FIG. 8, the image pickup tube 608 contains means for generating a field synchronizing pulse train SF having a period of TF of about ⅓ of an interval between times t1 and t2, and t2 and t3 . . . , which period is sufficient to eliminate the residual image, and a scanning line synchronizing pulse train SL shown at C in FIG. 8 having a period of TL=TFUB/L, where TFUB represents an interval of picking up the image during the period TF, that is, the vertical unblanking interval, and L the number of scanning lines which equals to 1024, for example. The image pickup tube 608 is supplied with a portion of the control signal B2 so that each time the lamp 607 flashes, during an interval between a first flash of the lamp and a second flash caused by the synchronizing pulse train SF, like the scanning of a conventional non-interlaced scanning type television pickup tube, the entire surface of the photoelectric converting surface of the pickup tube is scanned with L=1024 scanning lines with a period of TF in synchronism with the synchronizing pulse trains SF and SL. It is noted that only the first occurrence field following flashing is picked up. Accordingly, the video signal S1 produced by the image pickup tube 608 comprises a series of video signals S1A1a1 . . . S1A1a4, S1A2a1 . . . S1A2a4, . . . S1A12a13 . . . S1A12a16 for respective segments a1 . . . a16 of regions A1 through A12 as shown at D in FIG. 8

The video signal S1 thus produced by the image pickup tube 608 is applied to a binary encoder 611 to produce a binary video signal S4 as shown at E in FIG. 8 in which when the level of the video signal S1 is higher than a predetermined level, the binary video signal has a value of "1" whereas when the level is lower than the predetermined level, the binary video signal has a value of "0".

The binary video signal S4 is applied to a shift register group 612 of P shift registers, the number P being less than the number L (=1024) of scanning lines. In this example, P=8. Respective eight shift registers R1, R2 . . . R8 comprise serially connected Q memory elements, the number Q being less than the number N (=1024, for example) obtained by dividing the unblanking period TLUB of one scanning line of respective video signals S4A1a1, S4A1a2 . . . (hereinafter referred to as video signal S4') constituting the video signal S4 by the length of one picture element. In this example, Q=8. Respective registers R1 through R8 are respectively connected in series with a number (N-Q=1024-8, in this example) of delay circuits D12, D23 . . . D78, each delay circuit having a delay corresponding to the length of the serially connected memory elements. All registers are connected in series via the delay circuits as shown in FIG. 6.

In addition to the field synchronizing pulse SF and the scanning line synchronizing pulse SL, the image pickup tube 608 generates a picture element synchronizing pulse train SB having a period of TB=TLUB/N (N=1024) as shown at F in FIG. 8 in a further enlarged manner. The contents of shift registers R1 through R7 are sequentially shifted by a clock pulse, that is, the picture element synchronizing pulse train SB, starting from the first shift register R1. Let us denote the times at which the scanning line synchronizing pulse train SL appears sequentially by tL-0000, tL-0001, tL-0002 . . . tL-1024 (=tL-L) and the intervals between tL-0000 and tL-0001, between tL-0001 and tL-0002, . . . and between tL-1023 and tL-1024 (=tL-L) by scanning intervals T-1, T-2 . . . T-1024 (=T-L), respectively. Further, let us denote the times at which the successive pulses of the picture element snchronizing pulse train SB appear during the respective scanning periods by tB-0000, tB-0001, tB-0002, . . . tB-1024 (=tB-N).

Hereinafter, for the sake of description it is assumed that the image pickup tube 608 produces a video signal S4' (S4A1a1) by picking up the segment a1 of the pattern 601 at a time t1 and that the information stored in 64 (Q×P=8×8) memory elements of the registers R1 through R8 are read out as parallel information by the respective pulses of the picture element synchronizing pulse train SB. It can be readily understood that this corresponds to successive reading out of the parallel information from (Q×P=2×2; N=4) windows by positioning the image pickup tube at the center P20 and by starting from a predetermined picture element synchronizing pulse related to a picture element which generates the information of segment 6, as has been described in connection with FIGS. 2A and 2B.

Figure 6:
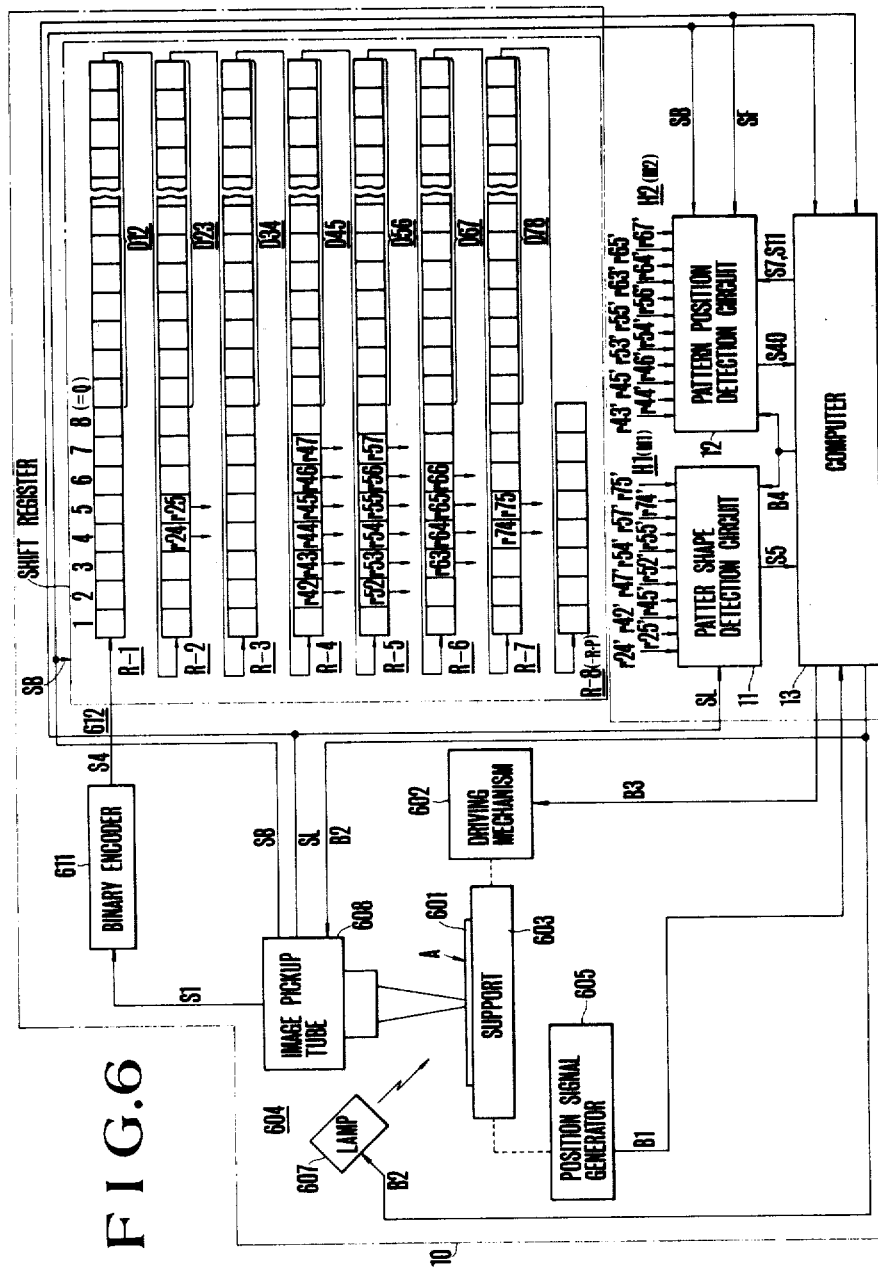
FIG. 6 is a block diagram showing one embodiment of the apparatus for examining a pattern according to this invention.

In the apparatus shown in FIG. 6, the parallel information is derived out, at time tB-0007 [=tB-000 (P-1)] in an scanning interval T-8, as information representing the entire area of a region b-1 (See FIG. 8 and FIG. 9) at the left upper corner of the field F1 of the image pickup tube which covers the segment a1 of the region A1 at time t1, the region b-1 having a width $l3 = 8l'/1024$ which is equal to $8 \delta 1$ ($\delta 1 = l'/1024$ or $= l'1/N$) and a height $\delta 2 = l'2/1024$, where $l1'$ represents a width of the field F1 and $l2'$ a height thereof. At a time tB-000 8 in the scanning interval T-8, information representing the entire area of a region b-2 having the same area as the region b-1 but displaced or shifted to the right by $\delta 1$ is derived out. In the same manner, at a time tB-(1024-1) (=tB $\{1024 \times (9\text{-}P)\text{-}1\}$) in the scanning interval T-8, information representing the entire area of region b-(1024-7) (b-$\{N \times (9\text{-}P)\text{-}(Q\text{-}1)\}$) at a position displaced to the right from the region b-1 of the field F1 by $(1024\text{-}8) \times \delta 1 (= \{N \times (9\text{-}P)\text{-}Q\} \times \delta 1)$ and having the same area as the region b-1 can be obtained. At a time tB-0007 in a scanning interval T-9, information representing a region b-(1024+1) (=N+1) at a position displaced downwardly from the region b-1 by $\delta 2$ is derived out. At a time in a scanning interval T-1024 ($\times$T-L), information representing a region b-(1024$\times$1016+1) (N$\times$(L-P)+1) at a position displaced downwardly from region b-1 by $(1024\text{-}8) \times \delta 2$ is obtained. At a time tB-(1024-1) in a scanning interval T-1024 (=T-L), information representing a region displaced to the right from the region b-1 of the field F1 by $(1024\text{-}8) \times \delta 1$ $(= \{N \times (a\text{-}P)\text{-}Q\}\delta 1)$ and displaced downwardly therefrom by $(1024\text{-}8) \times \delta 2 (= \{N \times (9\text{-}P)\text{-}Q\}\delta 2)$, that is, a region b-(1024$\times$1017-7) $(=b\text{-}\{N \times (L+1\text{-}P)\text{-}(Q\text{-}1)\})$ at the right lower corner of the field F1 can be derived out. In this manner, parallel information is produced, at an interval ranging from time tB-0007 between tL-0007 and tL-0008 to time tB-(1024-1) between tL-(L-1) and tL-L, to represent the entire area of the field F1 although the parallel information overlaps.

Although, in the foregoing description it was assumed that the information stored in 64 memory elements of the registers R1 to R8 are read out as parallel information at each pulse of the picture element synchronizing pulse train SB when a first memory element group M1 is constituted with the fourth and fifth memory elements r24 and r25 among Q memory elements of the register R2, the second, fifth and seventh memory elements r42, r45 and r47 of register R4; the second, fourth, fifth and seventh memory elements r52, r54, r55 and r57 of register R5; and the fourth and fifth memory elements r74 and r75 of register R7 and then signals r24', r25', r42', r45', r47', r52', r54', r55', r57', r74' and r75' are simultaneously derived out to constitute the binary video signal S4' respectively from these memory elements r24, r25, r42, r45, r47, r52, r54, r55, r57, r74 and r75, thereby producing a first parallel binary video signal H1. In the same manner, by constituting a second memory element group M2 with the third, fourth, fifth and sixth memory elements r43, r44, r45 and r46 of register R4; the third, fourth, fifth and sixth memory elements r53, r54, r55 and r56 of register R5; and the third, fourth, fifth and sixth memory elements r63, r64, r65 and r66 of register R6 and by simultaneously deriving out signals r43', r44', r45', r46', r53', r54', r55', r56', r63', r64', r65' and r66' of the binary video signal S4' from respective memory elements r43, r44, r45, r46, r53, r54, r55, r56, r63, r64, r65 and r66, a second parallel binary video signal H2 can be obtained.

Figure 11:
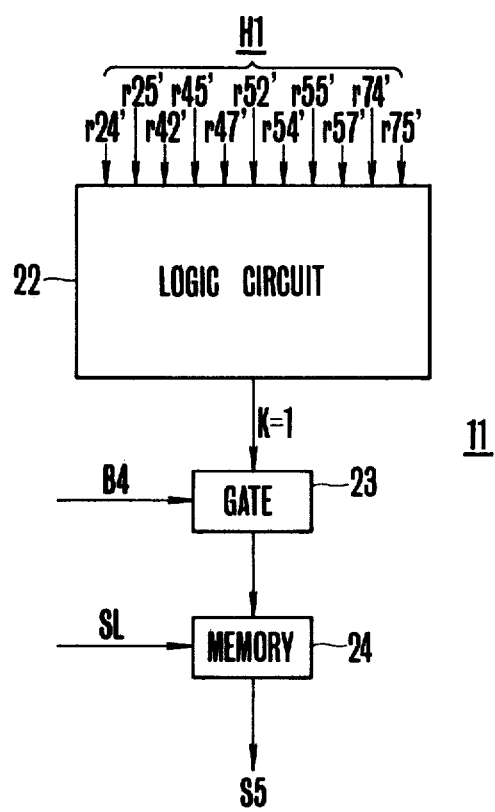
FIG. 11 is a block diagram showing a circuit construction embodying the mode shown in FIGS. 3A and 3B.

The first binary parallel video signal H1 is supplied to a pattern shape examining circuit 11 which as shown in FIG. 11 comprises a logic circuit 22 which logically processes an equation $$K = KK \ V \ \overline{KK'} \ V \ KY \ V \ \overline{KY'} \quad (3)$$

in which in the transverse direction (X direction)

$$KX = r\overline{42}' \Lambda r\overline{52}' \Lambda r45' \Lambda r55' \Lambda r\overline{47}' \Lambda r\overline{57}'$$

$$KX' = r42' \Lambda r52' \Lambda r\overline{45}' \Lambda r\overline{55}' \Lambda r47' \Lambda r57'$$

and in the longitudinal direction (Y direction)

$$KY = r\overline{24}' \Lambda r\overline{25}' \Lambda r54' \Lambda r55' \Lambda r\overline{74}' \Lambda r\overline{75}'$$

$$KY' = r24' \Lambda r25' \Lambda r\overline{54}' \Lambda r\overline{55}' \Lambda r74' \Lambda r75'$$

according to the aforementioned logical equation (1).

The pattern shape examining circuit 11 further comprises a gate circuit 23 which supplies the value of equation (3) when its value of K is "1" to a memory circuit 24.

In response to the field synchronizing pulse train SF and the picture element synchronizing pulse train SB supplied by the image pickup tube 608, the computer 13 supplies, as shown at H in FIG. 8, a gate signal B4 which is "1" between times tB-0007 and tB-1024 during an interval between times tL-0007 and tL-0008, between times tB-0007 and tB-1024 during an interval between times tL-0008 and tL-0009, and between times tB-0007 and tB-1024 during an interval between times tL-(L-1) and tL-L, whereas "0" during other intervals. The gate signal B4 is applied to the gate circuit 23 for enabling or opening the same when the gate signal is "1". The memory circuit 24 is supplied with the scanning line synchronizing pulse train SL so as to clear the content of the memory circuit 24 each time a pulse of the scanning line synchronizing pulse train SL arrives.

Thus, the information stored in the memory circuit 24 produces a first examination output S5 showing whether the examined pattern has a prescribed shape or not. The logical circuit 22 processes equation (3), the output of the logic circuit 22 is supplied to the memory circuit 24 through the gate circuit 23 controlled by the gate signal B4 (see FIG. 8, H) and the memory circuit 24 is reset by the synchronizing pulse train SL, so that the output S5 is "1" only when the width of the pattern appearing in the regions b-1 to b-(1024-7), b-(1024+1) to b-(1024$\times$2-7) . . . b-(1024$\times$1016+1) to b-(1024$\times$1017-7) is less than 5$\times\delta$ 1 (since the spacings between the memory elements r42 and r52 and between the memory elements r47 and r57 correspond to five picture elements) and the height is less than 5$\times\delta$ 2 (since the spacings between the memory elements r24 and r25 and between r74 and r75 correspond to 5 picture elements). This corresponds to the above description by which a pattern width less than 5 picture elements is judged as a defect where Lm=2$\mu$ and the width of one picture element is 0.4$\mu$, such judgement being suitable for the examination of micropatterns. The examination output S5 is supplied to the computer 13.

Figure 10:
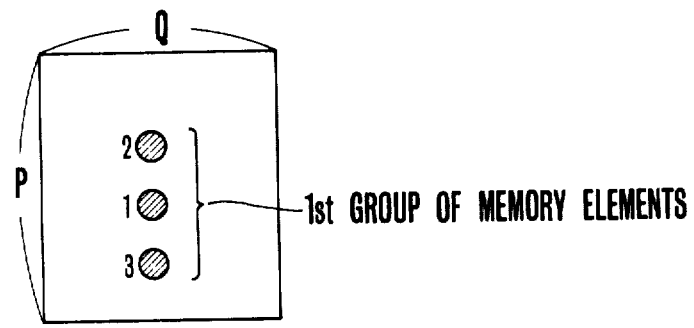
FIGS. 10A, 10B and 10C are diagrams showing different expedients of examination utilized by the apparatus shown in FIG. 6 for examining patterns.
Figure 10:
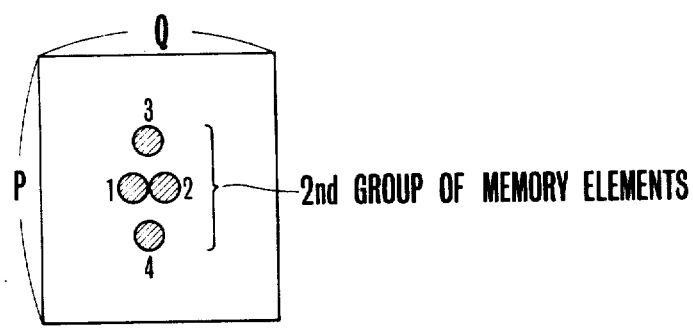
Figure 10:
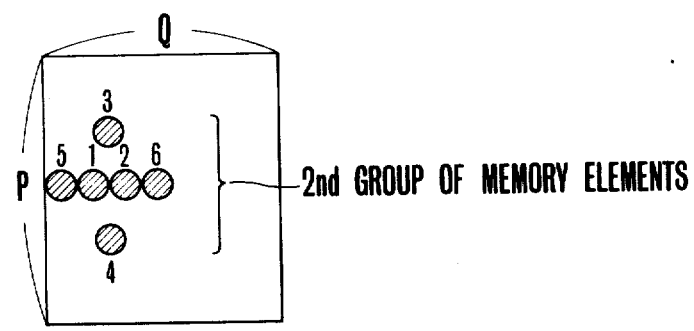

Such method of examining micropatterns follows the first mode based on the principle described with reference to FIGS. 3A and 3B. Considering the operation of the apparatus shown in FIG. 6, in this mode, a first memory group is first constituted by at least one memory element 1 among a plurality of (Q) memory elements of an intermediate shift register other than the first register R1 and the last register R8 among a plurality (P) of shift registers, at least one memory element 2 of a plurality of (Q) memory elements of a shift register between the first and the intermediate shift registers, and at least one memory element 3 of a plurality (Q) of memory elements of a shift register between the last and the intermediate shift registers, as shown in FIG. 10A. Then, by simultaneously deriving out binary video signals from the memory elements 1, 2 and 3, a first examination parallel binary video signal can be obtained and thereafter, this video signal is logically processed according to equation (3) to produce the first examination output S5.

Figure 12:
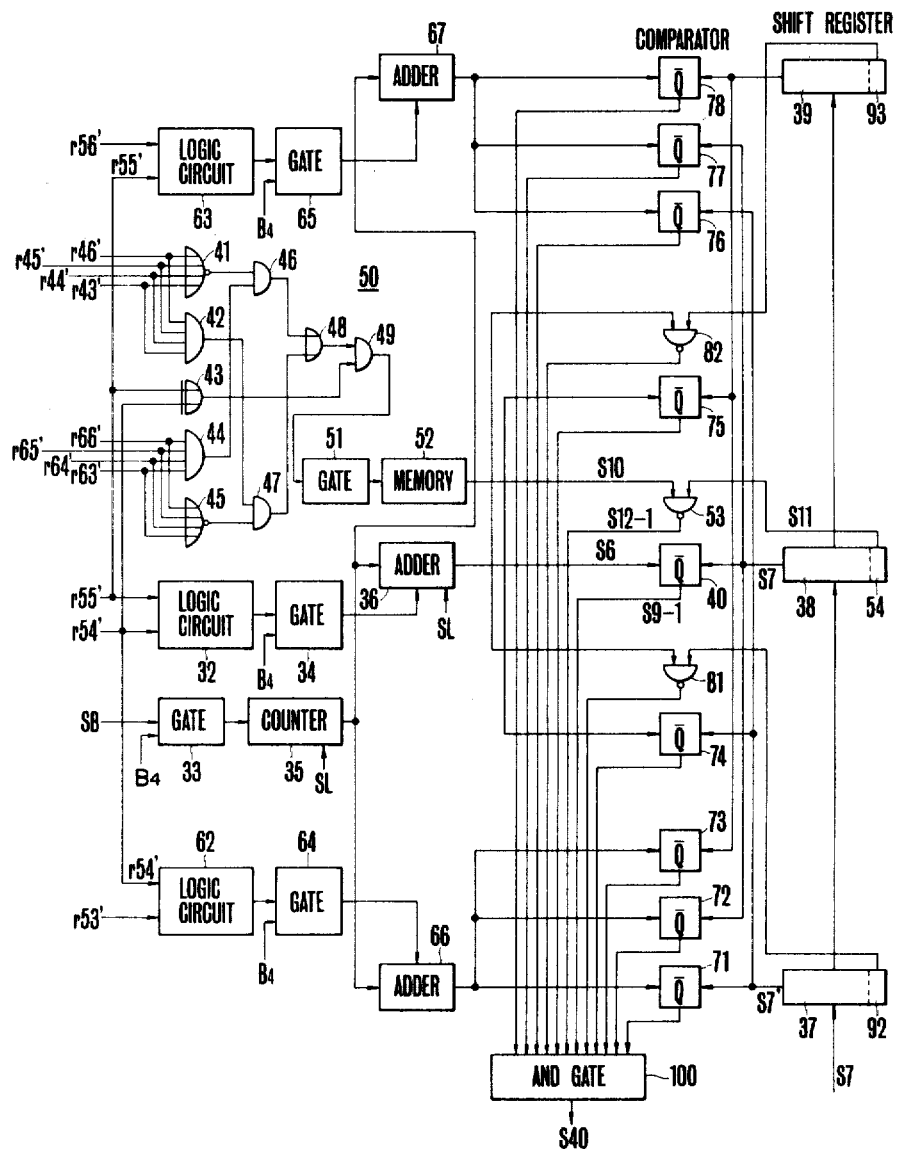
FIG. 12 is a block diagram showing a circuit construction embodying the mode shown in FIG. 4.

The second parallel binary video signal H2, on the other hand, is applied to a pattern position examining circuit 12. As shown in FIG. 12, the pattern position examining circuit 12 comprises a logic circuit 32 which processes a logical equation $$W = (r54' \wedge \overline{r55'})(\overline{r54'} \wedge r55') \tag{4}$$

according to equation (2), gate circuits 33 and 34 controlled by the gate signal B4, a counter 35 which counts the number of pulses of the picture element synchronizing pulse train SB supplied through the gate circuit 33 and resets itself by each pulse of the scanning line synchronizing pulse train SL, and an adder 36 supplied with the output of the counter 35 at the timing of output of the gate circuit 34 for adding the output of the counter 35 each time the logic circuit 32 produces an output "1". The adder 36 is reset by each pulse of the scanning line synchronizing pulse train LS.

Thus, the adder 36 produces pattern position information S6 which obviously corresponds to the pattern data obtained by the first expedient shown in FIG. 5A of the second mode of the method of examination according to this invention.

Figure 9:
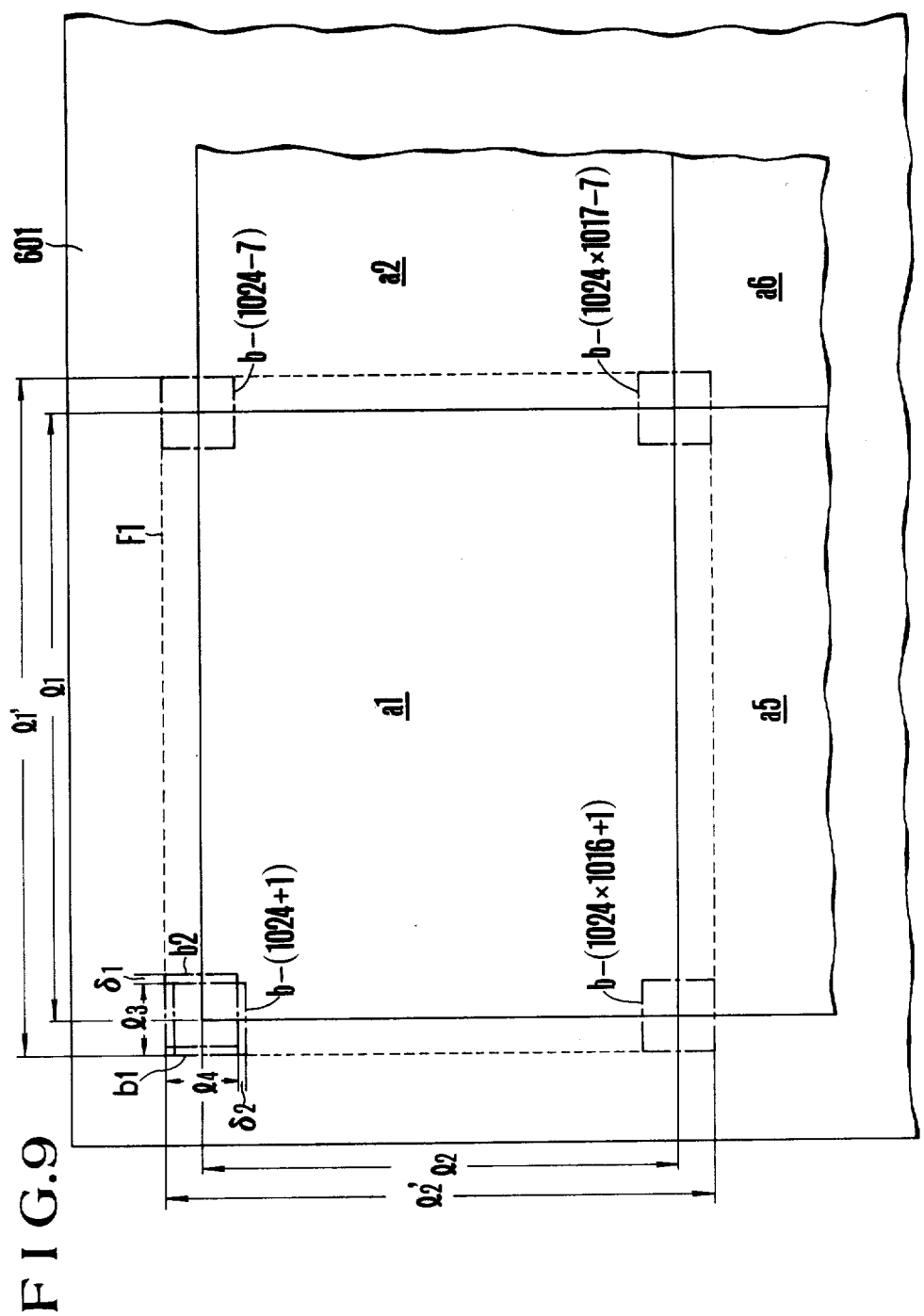
FIG. 9 is a diagram for explaining the shift of parallel information in the apparatus shown in FIG. 6.

Since the logic circuit 32 processes equation (4) and the adder 36 counts the number of the pulses of the picture element pulse train SB supplied thereto through gate circuit 33 and is reset by each pulse of the scanning line pulse train SL, the information S6 represents, in terms of the length δ 1 of a picture element, the sum of lengths between the starting point of one scanning line of and respective edge positions at the regions b-1 to b-(1024-7), b-(1024+1) to b-(1024×2-7) . . . b-(1024×1016+1) to b-(1024×1017-7) of the pattern to be examined which extends in the longitudinal direction as viewed from FIG. 9.

The pattern position detection circuit 12 comprises shift registers 37, 38 and 39 connected in parallel. The computer 13 is set with design pattern information necessary to form a pattern on the pattern region A and reference pattern position information S7 corresponding to the pattern position information S6 produced by the adder 36 is applied to shift register 38 via shift register 37. The information S7 supplied from shift register 38 is applied to a comparator 40 which also receives the information S6 from the adder 36. Where a pattern to be examined elongates in the longitudinal direction at each of the regions b-1 to b-(1024-7), b-(1024+1) to b-(1024×2-7) . . . b-(1024×1016+1) to b-(1024×1017-7), the comparator 40 produces a second examination output S9-1 according to the basic expedient of the second mode which shows whether the pattern being examined is at a predetermined position or not. The comparator 40 has an inverting output $\overline{Q}$ and delivers out the output S9-1 of "0" when S6 coincides with S7 and the output S9-1 of "1" when S6 does not coincide with S7.

As shown in FIG. 12, the pattern position detection circuit 12 comprises a logic circuit generally designated by reference numeral 50 and constituted by a NOR gate circuit 41 and an AND gate circuit 42 supplied with outputs r43' to r46', an exclusive OR gate circuit 43 supplied with outputs r55' and r54', an AND gate circuit 44 and a NOR gate circuit 45 supplied with outputs r63' to r66', an AND gate circuit 46 supplied with the outputs of the NOR gate circuit 41 and the AND gate circuit 44, an AND gate circuit 47 supplied with the outputs of the AND gate circuit 42 and the NOR gate circuit 45, an OR gate circuit 48 supplied with the outputs of the AND gate circuits 46 and 47, and an AND gate circuit 49 supplied with the outputs of the OR gate circuit 48 and the exclusive OR gate circuit 43. The output of the AND gate circuit 49 is applied to a memory circuit 52 corresponding to the memory circuit 24 shown in FIG. 11 through a gate circuit 51 corresponding to the gate circuit 23 shown in FIG. 11. The memory circuit 52 produces an output S10 even when the pattern being examined comprises a linear horizontal edge (shown by H in FIG. 5A) and this output signal S10 is applied to one input of a NAND gate circuit 53. To the other input of this NAND gate circuit 53 is supplied information S11 from the computer 13 via a shift register 54, the information S11 corresponding to the output S10 of the memory circuit 52. Thus, the NAND gate circuit 53 produces a third examination output 12-1 which is "0" when S10 is "1" and S11 is "1" and which is "1" when S10 does not coincide with S11.

To detect the position of a pattern, it is necessary to detect not only the vertical edge but also the horizontal edge H, so that to have better understanding of the operation of the logic circuit 50, the following description is supplemented.

Where the horizontal edge lies on the memory elements r54 and r55 between the memory elements r43, r44, r45, r46 and the memory elements r63, r64, r65, r66 and where the pattern occupies the memory elements r43, r44, r45 and r46, the binary video signals r43', r44', r45' and r46' are "1" and the binary video signals r63', r64', r65' and r66' are "0". Accordingly, the AND gate circuit 42 and the NOR gate circuit 45 produce "1" outputs. The AND gate circuit 47 also produces "1" output, which is applied to one input of the AND gate circuit 49 via OR gate circuit 48.

Also, the horizontal edge merges into the vertical edge at the corner and further, it undulates irregularly owing to quantizing error and manufacture errors to be described later. Accordingly, when the signals r54' and r55' are logically processed according to logical equation (2), signal "1" showing the presence of the vertical edge would be produced. Since logical equation (2) represents the logic of an exclusive OR, the exclusive OR gate circuit 43 would produce an "1" output at the beginning of the horizontal edge or at the undulation. This "1" output is supplied to the other input of AND gate circuit 49 to cause it to produce an output "1" which is applied to one input of the NAND gate circuit 53 via gate circuit 51 and memory circuit 52. The first bit of the information S11 supplied to the other input of the NAND gate circuit 53 is "1" representing the horizontal edge so that the NAND gate circuit 53 produces "0" output as the third examination output S12-1. In this manner, such a misjudgement that absence of the vertical edge is erroneously judged as presence of the vertical edge with only the second examination output S9-1 owing to the unstable data fetching caused by the horizontal edge can be prohibited at the AND gate 100 by the third examination output S12-1. Thus, the output S10 compensates the third examination output S12-1 in order not to recognize the normal horizontal edge as a defect.

The second and third examination outputs are applied to an AND gate circuit 100 which, when enabled, produces a fourth examination output S40 which is "1" for indicating defective information and "0" for indicating normal information.

The procedure of obtaining the fourth examination output S40 from the second and third examination outputs S9-1 and S12-1 is denoted by a first embodiment of the second mode of the method of this invention, this embodiment being summarized as follows with the aid of FIG. 10B.

More particularly, from a second group of the memory elements comprising adjacent two memory elements 1 and 2 of a plurality (Q) of memory elements of an intermediate shift register among a plurality (P) of shift registers except the first and the last shift registers, a third memory element 3 of a plurality (Q) of memory elements of a shift register between the first register and the intermediate register, and a fourth memory element 4 of a plurality (Q) of memory elements of a shift register between the intermediate and the last shift registers are derived out simultaneously video signals to constitute a second examination parallel binary signal.

Then, the first memory element 1 is scanned earlier than the second memory element 2 with a scanning line related thereto to produce binary video signals. When the contents of the binary video signal obtained from the first and second memory elements differ from each other, pattern position information 56 is produced wherein the sum of values of a function of the distance between a reference position on the scanning line (for example, the position of the first picture element) and the positions of the picture elements corresponding to the first and second memory elements is represented by the number of the picture elements.

The pattern position information S6 is compared with a reference pattern position information S7 which is performed by the design pattern information utilized to form a pattern to be examined in a pattern region to produce second examination output S9-1 which represents whether the pattern is at a predetermined position or not in the direction of scanning the pattern region.

The parallel binary video signals from the third and fourth memory elements 3 and 4 of the second group of the memory element are logically processed to produce logically treated binary video signals S10 which, when the third and fourth memory elements are aligned step by step of one picture element length, are utilized to produce the third examination output S12-1. This S10 represents whether or not the logically treated binary video signals have different contents at positions on both vertical sides of one picture element (corresponding to memory element 1 or 2). The output S12-1 represents whether the third and fourth memory elements are at a predetermined position or not in the direction of scanning by comparing S10 with S11 which is supplied from shift register 54.

In the circuit shown in FIG. 12, there are also provided logic circuits 62 and 63, gate circuits 64 and 65, and adders 66 and 67 respectively corresponding to the logic circuit 32, gate circuit 34 and adder 36. There are also provided comparators 71 to 78 corresponding to the comparator 40, NAND gate circuits 81 and 82 corresponding to the NAND gate circuit 53, and registers 92 and 93 corresponding to the register 54. The output of adder 66 is applied to comparators 71 to 73 while the output of the adder 36 is applied to the comparators 74 and 75. The output of the memory circuit 52 is applied to the NAND gate circuits 81 and 82 whereas the output of adder 67 is applied to comparators 76 to 78. The output of register 37 is applied to comparators 74 and 76, the output of register 38 is applied to comparators 72 and 77, and the outputs of registers 92 and 93 are applied to inputs of NAND gate circuit 81 and 82, respectively. At this time, the signals r54' and r53' and signals r55' and r56' are applied to logic circuits 62 and 63, respectively.

The purpose of processing and adding together signals r53', r54', r55', and r56' and comparing the sum with the design pattern data produced by shift registers 37, 38 and 39 is to examine the pattern by considering the deviation of the mask setting as shown in FIG. 5B. The predetermined design data from shift registers 37, 38 and 39 is compared with the pattern data at respective deviated positions. The fifth examination outputs produced by comparators 71 through 78, being inverting logic Q of the comparison result, are applied to the input of AND gate circuit 100 which, when enabled, produces the fourth examination output S40. This method of examination comprises a second embodiment of the second mode of this invention and can be summarized as follows with the aid of FIG. 10C.

More particularly, from a second group of the memory elements comprising adjacent first, second, fifth and sixth memory elements 1, 2, 5 and 6 among Q memory elements of an intermediate register of a plurality (P) of shift registers except the first and the last shift registers, a third memory element 3 among Q memory elements of a shift register between the first and the intermediate shift registers, and a fourth memory element 4 among Q memory elements of a shift register between the intermediate and the last shift registers, a second examination parallel binary video signal can be obtained by simultaneously reading out binary video signals from various memory elements that comprise the second group.

The fifth, first, second and sixth memory elements are scanned in the order mentioned by a scanning line related thereto to produce a binary video signal. When the content of the binary video signal varies between the first and fifth memory elements, or between the first and second memory elements, or between the second and sixth memory elements, the second pattern position information would be produced in which the sum of values of a function of the distance between a reference point on the scanning line and the positions of picture elements corresponding to the fifth and first or second and sixth memory elements is represented by the number of the picture elements.

The second pattern position information is compared with a reference pattern position information which is predetermined by the design pattern information utilized to form a pattern to be examined in a pattern region to produce a fifth examination output which judges whether the pattern is at a predetermined position or not in the direction of scanning thereof.

Toperform the modified examination as shown in FIG. 5C, (j+1)th, j-th and (j-1)th design pattern data are given to shift registers 37, 38 and 39, respectively, to compare them with the data of a pattern to be examined. Where it is desired to examine the (j+2)th and (j-2)th design pattern data, the numbers of the shift registers and of the comparators are increased by 2, respectively. Denoting this method as a third embodiment of the second mode of this invention, this embodiment can be summarized as follows with the aid of FIG. 5C.

Where a first memory element 1 is scanned earlier than a second memory element 2, belonging to a second group of memory elements, by a scanning line related thereto to produce binary video signals and where the contents of the binary picture element signals generated by the first and second memory elements differ from each other, pattern position information can be obtained in which the sum of values of a function of the distance between a reference position on the scanning line and the picture elements corresponding to the first and second memory element is represented by the number of the picture elements. Then, the pattern position information is compared with a reference pattern position information which has been preformed from design pattern information adapted to form a pattern on a pattern region to produce a second examination output representing whether a video signal produced by scanning the pattern region is located at a predetermined position in the scanning direction or not. Then the pattern position information is compared with a reference pattern position information which is out of phase by a time corresponding to one scanning time of the second parallel binary video signal thereby producing a sixth examination output representing whether or not the pattern to be examined is located at a predetermined position in the direction of scanning the pattern region.

When any one of the inputs to the AND gate circuit 100 is "0", the AND gate circuit 100 produces the fourth examination output S40 which is representative of the normal judgement output "0". This output is applied to the computer 13, whereby the computer produces an examination output based on the examination outputs S5 and S40 which judges whether the pattern being examined is a predetermined one and located at a predetermined position or not.

Actually, the comparator 40 compare the reference pattern position information S7 with the information S6 to judge whether the value of information S6 is coincident in a range of ±E from the value of information S7 or not. If the value of S6 is coincident in this range, it is judged that the pattern being examined is at the predetermined position and this condition is represented by a binary "0". The operation of the comparator 40 is based on the fact that, since the value of the information accompanies a quantitizing error corresponding to the number of the contours of the pattern to be examined, if the margin ±E described were not used, an output S9-1 would be formed showing that the pattern is not located at the predetermined position although actually the pattern is located at the predetermined position. Accordingly, the range ±E is set to a value corresponding to the number of contours of a known pattern.

Thus, when the vertical edge undulates by $\delta i$ which is random variable within the maximum value $\delta$ max, that is, $|\delta| \leq \delta$ max, the worst value of $$\sum_{i=1}^{N} xi$$

described in connection with FIG. 4 should be $$\sum_{i=1}^{N} Xi + N \delta \text{ max}.$$

Assume now that $\Sigma xi = 1200$ and $N \delta \text{ Max} = 34$, for example, then $\Sigma(xi + \delta i) \leq 1234$. However, 34 is neglected as the aforementioned value E. When the pattern is positioned on the lefthand side in FIG. 9, in a certain case, Xi regarding the first edge of the pattern assumes a value of 10, for example. Since 10 is smaller than 34, it might be neglected as a margin E. For this reason, an initial value $\alpha > E$ is previously assigned to xi, respectively.

In examining the horizontal edge, in the foregoing description, the fact that the horizontal edge, at each of its ends, merges into the vertical edge and that at the same time, the horizontal edge has an irregular undulation was taken into consideration. Since the horizontal edge accompanied with the irregular undulation due to pattern preparation and quantization is equivalent to an ideal straight horizontal edge which is broken and cut away at the irregular undulation, vertical edges are detected in accordance with the unduation when examining the horizontal edge. A value of $\Sigma xi$ calculated on the basis of the detection of the vertical edges due to the irregular undulation over a predetermined width of the pattern cannot coincide with the design pattern data for the predetermined width even when the pattern is normal. Consequently, the examination output S9-1 indicates a defect output "1". Thus, in the examination of the horizontal edge in the foregoing description, the examination data of vertical edges was fetched by the logic circuit 50 and the examination output S12-1 was rendered "0" to prohibit the examination output S40 of "1" representing a defect to be delivered out from the AND circuit 100 even when the examination output S9-1 was "1" indicating a defect.

Examination of the horizontal edge is possible, however, without the use of the logic circuit 50. The size or amplitude of irregular undulation accompanied by the horizontal edge normally extends over the spacing of two to three scanning lines when distortion in the pattern sensing system including the image pickup tube and optical system is considered. An abnormal or defective loss of a pattern, on the other hand, is as extensive as the spacing of five scanning lines or more. Accordingly, when the outputs of the AND circuit 100 fetched by the computer 13 successively assume "1" over five scanning lines or more, judgement is establised to indicate a defect whereas when these outputs successively assume "1" over less than five scanning lines, judgement is established to indicate the presence of the irregular undulation accompanied by the horizontal edge. That is, as far as the outputs of AND circuit 100 fetched by the computer 13 do not assume "1" successively over five scanning lines or more, judgement is established to indicate the presence of the horizontal edge. The number of the scanning lines of five as the judging reference as above can, of course, be varied depending on distortion in the pattern sensing system and the minimum size of detection set in the design pattern data comparing method employed.

Further, because $\Sigma xi$ of the predetermined width and $\Sigma xi$ of the irregular undulation accompanied by horizontal edge are different, the value of $\Sigma xi$ obtained by the adder 36 during the previous scanning line period can be compared with the value of $\Sigma xi$ obtained by the adder 36 during the subsequent scanning line period so that the existence of a horizontal edge may be determined when the Σxi value associated with the subsequent scanning line is different from that associated with the previous scanning line.

What is claimed is:

1. A method of examining a pattern comprising the steps of:
   (a) detecting a pattern to be examined in accordance with regions of the pattern corresponding to picture elements on scanning lines of a sensor to produce binary video signals respctively from said regions;
   (b) memorizing as parallel information the binary video signals in P shift registers having each Q memory elements, said P shift registers being connected in series via delay circuits each consisting of N-Q memory elements, where N is the number of picture elements on one scanning line, $Q<N$ and $P<N$;
   (c) fetching said parallel information for logically processing the same so as to generate examination outputs pertaining to the shape and position of the pattern to be examined, said examination output pertaining to the position of the pattern to be examined including examination outputs concerning vertical and horizontal edges of the pattern; and
   (d) judging the existence of a horizontal edge when defective pattern position data on the basis of detection of vertical edges is obtained from successive scanning lines of less than a predetermined number.

2. A method of examining a pattern comprising the steps of:
   (a) detecting a pattern to be examined in accordance with regions of the pattern corresponding to picture elements on scanning lines of a sensor to produce binary video signals respctively from said regions;
   (b) memorizing as parallel information the binary video signals in P shift registers having each Q memory elements, said P shift registers being connected in series via delay circuits each consisting of N-Q memory elements, where N is the number of picture elements on one scanning line, $Q<N$ and $P<N$;
   (c) fetching said parallel information for logically processing the same so as to generate examination outputs pertaining to the shape and position of the pattern to be examined, said examination output pertaining to the position of the pattern to be examined including examination outputs concerning vertical and horizontal edges of the pattern; and
   (d) judging the existence of a horizontal edge when the value of Σxi associated with the subsequent scanning line is different from that associated with the previous scanning line, where Xi represents the distance between a picture element corresponding to the pattern region representative of a vertical edge and a reference point on the respective scanning lines.

3. A method of examining a pattern comprising the steps of:
   (a) scanning a pattern region formed with a pattern to be examined to obtain a video signal and then converting the same into a binary video signal;
   (b) applying said binary video signal to a plurality (P) of shift registers, the number P being less than the number of scanning lines necessary for producing the binary video signal from the entire area of the pattern, each shift register including Q memory elements connected in series wherein Q is less than N which is obtained by dividing one scanning line of said binary video signal with the length of one picture element, said plurality of shift registers being connected in series through delay circuits having each a delay corresponding to the length of (N-Q) memory elements connected in series;
   (c) constituting a first group of memory elements with at least one memory element among Q memory elemetns of an intermediate shift register of said serially connected P shift registers except the first and the last shift registers, at least one memory element among Q memory elements of a shift register between said first and intermediate shift registers, and at least one memory element among Q memory elements of shift register between said last and intermediate shift registers, and simultaneousely deriving out said binary video signals respectively from said plurality of memory elements of said first group to form a first examination parallel binary video signal;
   (d) constituting a second group of memory elements with adjoining first and second memory elements among Q memory elements of an intermediate shift register of said serially connected P shift registers, a third memory element among Q memory elements of a shift register between said intermediate shift registers, and a fourth memory element among Q memory elements of a shift register between said intermediate and the last shift registers, and simultaneously deriving out said binary video signals respectively from said memory elements of said second group to constitute a second examination parallel binary video signal;
   (e) logically processing said first examination parallel binary video signal to obtain a first examination output representing whether said pattern is a predetermined pattern or not;
   (f) producing pattern position information, when the first memory element of said second group is scanned earlier than said second memory element of the same group on one scanning line related to said first and second memory elements thereby producing binary video signals and when the contents of the binary video signals produced by said first and second memory elements differ from each other, by representing the sum of values of a function of the distance between a reference position on said one scanning line and the positions of picture elements corresponding to said first and second memory elements in terms of the number of the picture elements;
   (g) comparing said pattern position information with reference pattern position information prepared from design pattern information utilized to form said pattern in said pattern region, thereby obtaining a second examination output representing whether or not said pattern is located at a predetermined position in the direction of scanning said pattern region;
   (h) logically processing the parallel binary video signals obtained from said third and fourth memory elements of said second group to produce logically treated binary video signals which, when said third and fourth memory elements are aligned step by step of one picture element length, are utilized to produce a third examination output, said logically treated binary video signals representing whether or not they have different contents at positions on both vertical sides of one picture element, said third examination output representing whether said third and fourth memory elements are at a predetermined position or not in the direction of scanning;

(i) compensating said second examination output with said third examination output in order not to recognize the normal horizontal edge as a defect, producing a fourth examination output; and (j) producing a final examination output based on said fourth and first examination outputs, said final examination output representing whether said pattern is a predetermined pattern or not and whether said pattern is located at a predetermined position or not.

4. A method of examining a pattern comprising the steps of:

(a) scanning a pattern region formed with a pattern to be examined to obtain a video signal and when converting the same into a binary video signal;

(b) applying said binary video signal to a plurality (P) of shift registers, the number P being less than the number of scanning lines necessary for producing the binary video signal from the entire area of the pattern, each shift register including Q memory elements connected in series wherein Q is less than N which is obtained by dividing one scanning line of said binary video signal with the length of one picture element, said plurality of shift registers being connected in series through delay circuits having each a delay corresponding to the length of (N-Q) memory elements connected in series;

(c) constituting a first group of memory elements with at least one memory element among Q memory elements of an intermediate shift register of said serially connected P shifrt registers except the first and the last shift registers, at least one memory element among Q memory elements of a shift register between said first and intermediate shift registers, and at least one memory element among Q memory elements of a shift register between said last and intermediate shift registers, and simultaneously deriving out said binary video signals respectively from said plurality of memory elements of said first group to form a first examination parallel binary video signal;

(d) constituting a second group of memory elements with adjoining first, second, and fifth and sixth memory elements among Q memory elements of an intermediate shift register of said serially connected P shifrt registers except the first and last shift registers, a third memory element among Q memory elements of a shift register between said first and intermediate shift registers and a fourth memory element among Q memory elements of a shift register between said intermediate and last shift registers, and simultaneously deriving out said binary video signals from the memory elements of said second group to form a second examination parallel binary video signal;

(e) logically processing said first examination parallel binary video signal to obtain a first examination output representing whether said pattern is a predetermined pattern or not;

(f) producing first pattern position information, when the first memory element of said second group is scanned earlier than said second memory element of the same group on one scanning line related to said first and second memory elements thereby producing binary video signals and when the contents of the binary video signals produced by said first and second memory elements differ from each other, by representing the sum of values of a function of the distance between a reference position on said one scanning line and the positions of picture elements corresponding to said first and second memory elements in terms of the number of the picture elements;

(g) comparing said first pattern position information with reference pattern position information prepared from design pattern information utilized to form said pattern in said pattern region thereby obtaining a second examination output representing whether or not said pattern is located at a predetermined position in the direction of scanning said pattern region;

(h) sequentially scanning said fifth, first, second and sixth memory elements of said second group with a scanning line related thereto to produce a binary video signal, and generating second pattern position information when the contents of the binary video signal varies between said first and fifth memory elements, between said first and second memory elements, or between said second and sixth memory elements, said second pattern position information representing the sum of values of a function of the distance between a reference position on said scanning line and the positions of picture elements corresponding to said fifth and first or second and sixth memory elements by the number of the picture elements;

(i) comparing said second pattern position information with reference pattern information prepared from design pattern information utilized to form said pattern in said pattern region to obtain a fifth examination output representing whether or not said pattern is located at a predetermined position in the direction of scanning said pattern region;

(j) logically processing the parallel binary video signal obtained from said third and fourth memory elements of said second group to produce logically treated binary video signals which, when said third and fourth memory elements are aligned step by step of one picture element length, are utilized to produce a third examination output, said logically treated binary video signals representing whether or not they have different contents at positions on both vertical sides of one picture element, said third examination output representing whether said third and fourth memory elements are at a predetermined position or not in the direction of scanning;

(k) compensating said second examination output with said third examination output in order not to recognize the normal horizontal edge as a fault, thus producing a fourth examination output; and (l) producing a final examination output based on said fourth and first examination outputs, said final examination output representing whether said pattern is a predetermined pattern or not and whether said pattern is locted at a predetermined position or not.

5. A method of examining a pattern comprising the steps of:
  (a) scanning a pattern region formed with a pattern to be examined to obtain a video signal and then converting the same into a binary video signal;
  (b) applying said binary video signal to a plurality (P) of shift registers, the number P being less than the number of scanning lines necessary for producing the binary video signal from the entire area of the pattern, each shift register including Q memory elements connected in series wherein Q is less than N which is obtained by dividing one scanning line of said binary video signal with the length of one picture element, said plurality of shift registers being connected in series through delay circuits having each a delay corresponding to the length of (N-Q) memory elements connected in series;
  (c) constituting a first group of memory elements with at least one memory element among Q memory elements of an intermediate shift register of said serially connected P shift registers except the first and the last shift registers, at least one memory element among Q memory elements of a shift register between said first and intermediate shift registers, and at least one memory element among Q memory elements of a shift register between said last and intermediate shift registers, and simultaneously deriving out said binary video signals respectively from said plurality of memory elements of said first group to form a first examination parallel binary video signal;
  (d) constituting a second group of memory elements with adjoining first and second memory elements among Q memory elements of an intermediate shift register of said serially connected P shift registers except the first and the last shift registers, a third memory element among Q memory elements of shift register between said first and intermediate shift registers, and a fourth memory element among Q memory elements of a shift register between said intermediate and last shift registers, and simultaneously deriving out said binary video signals respectively from said memory elements of said second group to form a second examination parallel binary video signal;
  (e) logically processing said first examination parallel binary video signal to obtain a first examination output representing whether said pattern signal is a predetermined pattern or not;
  (f) producing pattern position information, when the first memory element of said second group is scanned earlier than said second memory element of the same group on one scanning line related to said first and second memory elements thereby producing binary video signals and when the contents of the binary video signals produced by said first and second memory elements differ from each other, by representing the sum of values of a function of the distance between a reference position on said one scanning line and the positions of picture elements corresponding to said first and second memory elements in terms of the number of the picture elements;
  (g) comparing said pattern position information with reference pattern position information prepared from design pattern information utilized to form said pattern in said pattern region, thereby obtaining a second examination output representing whether or not said pattern is located at a predetermined position in the direction of scanning said pattern region;
  (h) comparing said pattern position information with reference pattern position information which is out of phase by a time corresponding to one scanning time of said second parallel binary video signal to produce a sixth detection output representing whether or not said pattern is located at a predetermined position in the direction of scanning said pattern region;
  (i) logically processing the parallel binary video signal obtained from said third and fourth memory elements of said second group to produce logically treated binary video signals which, when said third and fourth memory elements are aligned step by step of one picture element length, are utilized to produce a third examination output, said logically treated binary video signal represenging whether or not they have different contents at positons on both vertical sides of one picture element, said third examination output representing whether said third and fourth memory elements are at a predetermined position or not in the direction of scanning;
  (j) compensating said second examination output with said third examination output in order not to recognize the normal horizontal edge as a defect, produceing a fourth examination output; and
  (k) producing a final examination output based on said fourth and first examination outputs, said final examination output representing whether said pattern is predetermined pattern or not and whether said pattern is located at a predetermined position or not.

6. Apparatus for examining a pattern comprising:
a pattern examination signal generating unit for scanning a pattern to be examined to produce binary information of divisional regions of said pattern corresponding to picture elements of respective scanning lines as parallel information;
a pattern shape examination circuit unit supplied with said parallel information at timings corresponding to predetermined picture elements on respective scanning lines for examining the detail of said pattern;
a pattern position examining circuit unit supplied with said parallel information at timings corresponding to said predetermined picture elements to exmamine the position of said pattern; and
a computer responsive to examination outputs of said pattern shape examination circuit unit and said pattern position examination circuit unit for producing a reference pattern data to be compared with the examination pattern data produced by said pattern position examination circuit unit, and controlling said pattern examination signal generating unit, said pattern shape examination circuit unit and said pattern position examination circuit unit,
said pattern shape examination circuit unit including a first logic circuit for processing said parallel information, a first gate circuit connected to the output of said logic circuit and operated at a timing corresponding to said predetermined picture element, and a memory circuit for storing the output of said gate circuit which is reset by a pulse synchronized with the scanning line, and said pattern position detection circuit including a second logic circuit for logically processing parallel information of divisional regions of the pattern corresponding to at least two picture elements on one scanning line, a second gate circuit connected to the output of said second logic circuit, a counter connected to receive the output of said second logic circuit through said second gate circuit for effecting addition only when the output of said second logic circuit is at one level and cleared by said pulse synchronized with said scanning line, a comparator for comparing the output (that is the pattern data) of said counter with said reference data received from said computer through a shift register to produce a first examination output, and a third logic circuit for logically processing parallel information of divisional regions of said pattern corresponding to said picture elements on said one scanning line and picture elements on two scanning lines adjacent to said one scanning line for examining a horizontal edge of said pattern, an NAND gate circuit with one input connected to receive the pattern horizontal edge signal produced by said third logic circuit and the other input supplied with a horizontal edge pattern data formed under control of said computer via a register to produce a second examination output, and an AND gate circuit responsive to said first and second examination outputs for producing a final examination output.

7. Apparatus for examining a pattern according to claim 6 wherein said pattern position detection circuit further comprises a fourth logic circuit for logically processing one of said picture elements on said one scanning line and a picture element adjacent thereto on the same scanning line, a second counter connected to receive the output of said fourth logic circuit through a third gate circuit for effecting addition only when the output of said fourth logic circuit is at one level and cleared by said pulse synchronized with said scanning line, and a comparator for comparing the output of said second counter with a reference data received from said computer through said shift register.

8. Apparatus for examining a pattern according to claim 6 wherein said pattern position detection circuit further comprises a fifth logic circuit for logically processing the other of said picture elements on said one scanning line and a picture element adjacent thereto on the same scanning line, a third counter connected to receive the output of said fifth logic circuit through a fourth gate circuit for effecting addition only when the output of said fifth logic circuit is at one level and cleared by said pulse synchronized with said scanning line, and a comparator for comparing the output of said third counter with a reference data received from said computer through said shift register.

* * * * *